United States Patent [19]

Keible et al.

[11] Patent Number: 5,411,918

[45] Date of Patent: May 2, 1995

[54] PROCESSING MICROCHIPS

[75] Inventors: Edward A. Keible, Palo Alto, Calif.; Nicholas J. G. Smith, Cricklade, England

[73] Assignee: Raychem Limited, United Kingdom

[21] Appl. No.: 966,066

[22] PCT Filed: Jul. 16, 1991

[86] PCT No.: PCT/GB91/01172

§ 371 Date: Mar. 18, 1993

§ 102(e) Date: Mar. 18, 1993

[87] PCT Pub. No.: WO92/02038

PCT Pub. Date: Feb. 6, 1992

[30] Foreign Application Priority Data

Jul. 18, 1990 [GB] United Kingdom ............... 9015820

[51] Int. Cl.⁶ .................................... H01L 21/60
[52] U.S. Cl. ........................ 437/209; 437/183; 437/187; 437/203
[58] Field of Search ........... 437/209, 203, 183, 187; 156/643; 148/DIG. 50; 257/737, 774, 780

[56] References Cited

U.S. PATENT DOCUMENTS

| | | | |
|---|---|---|---|
| 3,893,156 | 7/1975 | Riseman | 357/67 |
| 4,398,993 | 8/1983 | Hume, Jr. et al. | 156/643 |
| 4,417,948 | 11/1983 | Mayne-Banton et al. | 56/643 |
| 4,612,083 | 9/1986 | Yasumoto et al. | 437/208 |
| 4,764,484 | 8/1988 | Mo | 437/203 |
| 4,824,802 | 4/1989 | Brown et al. | 437/187 |
| 4,861,425 | 8/1989 | Greer et al. | 156/644 |
| 4,936,950 | 6/1990 | Doan et al. | 437/203 |
| 5,032,541 | 7/1991 | Sakamoto et al. | 437/203 |
| 5,057,453 | 10/1991 | Endo et al. | 437/183 |

FOREIGN PATENT DOCUMENTS 0363297 4/1990 European Pat. Off.

OTHER PUBLICATIONS

Journal of Vacuum Science & Technology-Laser ablation of polymers, J. T. C. Yeh, May-Jun. 1986, pp. 653-658.

Journal of the Electrochemical Society-Selective Electroless Metal Deposition for Via Hole Filling in VLSI Multilevel Interconnection Structures, C. H. Ting etal, Feb. 1989, pp. 462-466.

Primary Examiner—Brian E. Hearn
Assistant Examiner—Kevin M. Pilardas
Attorney, Agent, or Firm—Sheri M. Novack; Herbert G. Burkard

[57] ABSTRACT

Uniaxially conductive connector formed in situ on microchip by laser drilling an insulating layer at least 5 micrometers thick to provide holes communicating with the chip bonding sites, and depositing metal in the holes to establish electrical connection with the bonding sites. Excimer U.V. laser ablation of a polyimide insulating layer is preferred, followed by removal of a surface layer (preferably of amorphous polyamide from the insulating layer to expose the ends of the metal deposited in the holes.

21 Claims, 1 Drawing Sheet

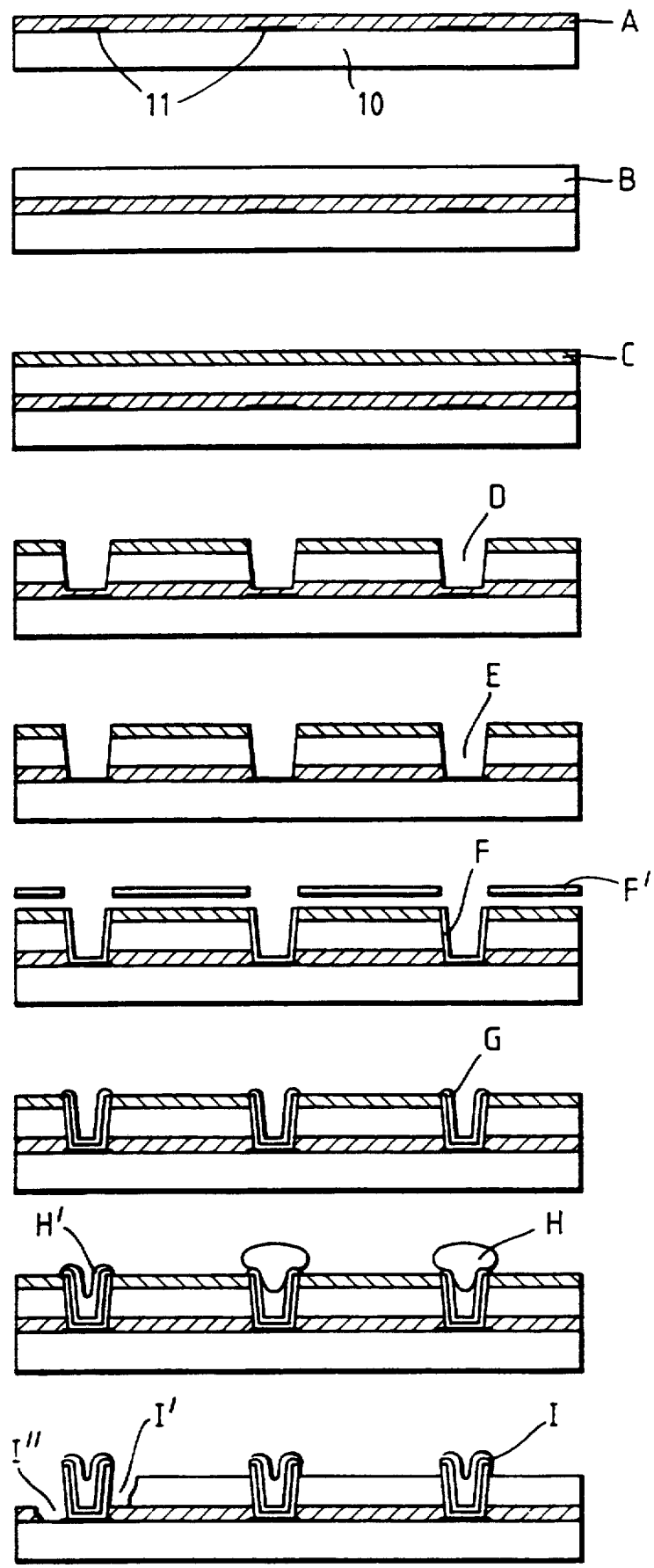

PROCESSING MICROCHIPS

This invention relates to processing of integrated circuit semiconductor devices and in particular, to a method of providing such devices, for example an integrated circuit semi-conductor chip, with projecting electrically conductive material on the device bonding sites.

A known method of providing vertical interconnection between the bonding pads of an integrated circuit chip and bonding sites of an associated package is the "flip chip" technique described, for example, in EP-A-0186818. In that technique, solder balls are provided on the input/output bonding pads of the chip, which are accessible through apertures in the 1-2 micrometers thick passivation layer normally covering the chip surface. That technique suffers from the problem that small solder balls or "bumps" tend to provide inadequate tolerance to thermal expansion stresses owing to their small height and resulting low degree of compliance, whereas larger solder balls introduce limitations on the closeness of pad spacing. The present invention provides a modified "flip chip" in which these problems are alleviated.

The invention accordingly provides a method of providing an integrated circuit semiconductor device with electrically conductive material projecting from the device bonding sites for bonding to a matching array of electrical contacts with which the device will be face-to-face in use, comprising (a) providing an electrically insulating layer at least 5 micrometers thick adhering to the surface of the device with one or more holes through the insulating layer each communicating with a bonding site, (b) depositing electrically conductive material within the hole(s) to establish electrical connection to the bonding site(s), and (c) excluding, or if necessary removing, deposited conductive material from the main surface of the insulating layer, so as to provide the conductive material substantially only within the said hole(s).

At first sight, it was not clear that a perforating operation could be successfully earned out in situ on the surface of the device, especially a microchip, without damaging the relatively delicate underlying bonding sites and nearby circuitry. However, it has proved possible to control the perforating operation so as to avoid damaging the bonding sites, as hereinafter described, even when the perforation is at least partly effected by the preferred high efficiency and high precision technique of ultraviolet laser ablation, preferably using an excimer laser at wave lengths of 193 (ArF), 308 (XeCl), or preferably 249 (KrF) nanometers. Other perforation techniques, for example reactive ion etching, or chemical etching could be used, but excimer laser ablation is preferred for its high speed and ability to perforate thick layers, possibly together with a final chemical etching step as hereinafter described.

It was also not expected to be possible to plate into one-ended "blind" holes of the diameters and depths preferred for this invention, but this has also been achieved, for example with hole diameters in the range of 5-200 micrometers, preferably 15-100 micrometers, and especially 25-50 micrometers.

After the deposition of the electrically conductive material, the method preferably includes the step of removing some or all of the insulating layer to expose at least part of conductive material deposited within the holes. In this way, projecting electrically conductive material taller than the known solder balls can be provided on chip bonding sites for subsequent connection to chip packaging arrangements.

When using the preferred laser ablation perforating technique, it is theoretically possible to limit the number of laser pulses or "shots" to drill exactly through the insulating layer adhering to the device surface and overlying the bonding sites, without damaging the underlying sites themselves. However, in practice, this can be difficult owing to slight fluctuations in the thickness of the insulating layer and/or to variations in the light flux actually reaching the insulating surface to be ablated, for example owing to build-up of contaminants on the laser system optics.

These difficulties are ingeniously overcome according to the present invention by providing an indicator layer underlying the insulating layer, which indicator layer comprises material which generates a discernable indication when directly acted upon by a first perforating operation (for example the preferred laser ablation). The first perforating operation can then be moderated, or replaced by a gentler second perforating operation, upon generation of the said indication.

It will be appreciated that any suitable perforating operation may be moderated or replaced in this way to avoid damage to the bonding sites, and this technique is especially well suited to the preferred laser ablation, which may be terminated upon generation of the said indication. The second perforating operation, for example chemical etching, may then be used to complete the perforation through the indicator layer to the underlying bonding sites.

The method according to this invention may include the step of applying the indicator layer, preferably by spin or spray coating, although other techniques may be used. The indicator layer may comprise any material which will generate a suitable indication when the first perforating operation reaches it, for example by generating colour in an etching liquid, or by emitting a characteristic detectable light frequency when ablated by the aforementioned ultra violet excimer laser, or by emitting characteristic ions which could be detected by mass spectrometry. By way of example, the indicator layer might comprise the phosphosilicate glass layer which is often already present and in this case has not yet been etched away to reveal the bonding sites, and could then be finally etched away after it has served as the indicator layer for the present purposes. If the chip is passivated (nuker the indication layer) with silica or silicon nitride, it may be desirable to open the bond pad windows after the laser drilling, for example by known etching techniques such as $CF_4/O_2$ plasma etching of silica, or $SF_6$ etching of silicon nitride. Known etch resists such as the "Spectrum Mega" range available from Micro-Image Technology Ltd, of Derby, or "Shipley 1400" plasma etch resists could be applied to protect the insulating layer if it is not itself sufficiently resistant to the etching process used.

Alternatively, an additional indicator layer could be applied before or after etching of the silica or other layer to reveal the bonding sites, examples of suitable indicator layers of this kind including film-forming fluoropolymers. Preferred examples of such polymers include coatable polyimides available from Hoechst under the Trade Marks "Sixef-33" and "Sixef-44" corresponding to the general formula

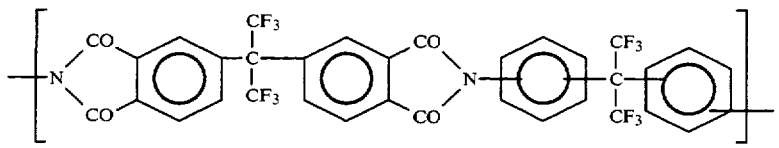

If applied after the etching of the silica or other layer to reveal the bonding sites, this indicator layer would rest directly on the bonding sites, leaving only its own material to be removed after perforation of the overlying insulator layer.

The additional indicator material could if preferred be removed, e.g. by chemical etching through a photoresist to leave the indicator layer overlying only the bonding sites.

The method according to the invention may also include the step of applying the insulating layer, preferably by spin or spray coating, although other techniques may be used. The insulating layer may comprise organic polymeric material, preferably polyimide or alternatively epoxies, or may alternatively comprise inorganic material such as phosphosilicate or borophosphosilicate glass. The insulating layer may be subsequently removed, partly or completely, for example by etching or dissolving in a suitable solvent. Where only partial removal is desired in order to provide projecting ends of the metal within the holes, a removable layer may be provided overlying the insulating layer, which removable layer may be dissolved or etched away to expose the ends of the conductive material deposited within the holes and to expose the surface of the insulating layer. Such a removable layer may comprise, for example, organic polymeric material, preferably amorphous polyamide.

The deposition operation preferably produces a tubular formation of the electrically conductive material in the holes, although deposition may be continued until the holes are completely filled, or alternatively filling materials such as solder may be introduced into the tubular formation. A preferred deposition operation involves sputtering of metal, preferably chromium followed by copper, onto the bonding pads and the interior surface of the holes, followed if necessary by removal of the metal from the main surface of the insulating layer. The chromium and copper are particularly useful on bonding pads of aluminium to provide a surface onto which further metal may be plated. The deposition operation may involve electroless plating of metal, for example nickel, onto the surfaces within the holes, followed by the removal of any metal which may have been electrolessly plated on the main surface of the insulating layer. Such electroless plating may deposit the plated metal directly onto the suitably catalysed surfaces of the holes, or onto previously deposited metal such as the aforementioned sputtered metals. Electroless plating directly onto the bonding pads will depend on the metals used in the pads and for the plating. The deposition operation may also involve application of solder, for example by evaporation through a shadow mask, into the holes and/or onto metal already in the holes. Any applied solder may subsequently be reflowed to improve its formation and adhesion.

Other aspects included in this invention are an integrated circuit semiconductor device, especially a chip, provided with electrically conductive material on one or more of the bonding sites by a method as hereinbefore described: and an integrated circuit semiconductor device, especially a chip, having on its surface an adherent indicator layer as hereinbefore described, which may also have adhered to the indicator layer an insulating layer preferably as hereinbefore described.

The various layers according to this invention may be applied to the integrated circuit chips or to multi-chip modules or wafer-scale integrated circuits by any appropriate means, for example by melt casting or solvent casting instead of the preferred spin or spray coating methods already mentioned. It is especially advantageous to perform the method of the present invention on semiconductor wafers before they are diced into individual chips.

Especially preferred polyimide materials for the insulating layer are those which are capable of being applied as a liquid solution followed by evaporation of the liquid and thermal treatment to provide a solid layer, preferably a cured layer. Examples of such materials include well-known coatable polyimides such as those available from National Starch and Chemical Corp. under the "Thermid" Trade Mark, or those available from Du Pont, Hitachi and Brewer Science Inc. (Missiouri).

Alternatively, it may be desirable to adhere films of polyimides such as those available under the Trade Mark "UPILEX" from Ube/ICI. One of these, "UPILEX R", is believed to be a relatively completely cyclised polymer having a repeat unit derived from bihenyl dianhydride and diaminodiphenylether, viz.

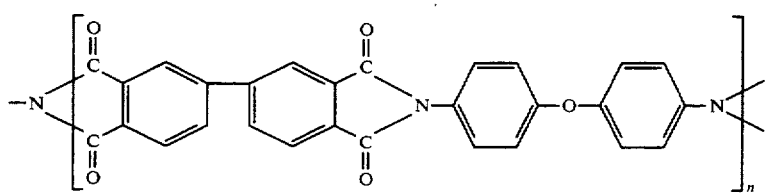

Most preferred, however, is "UPILEX S", which is believed to have a repeat unit derived from the same anhydride and phenylene diamine, viz.

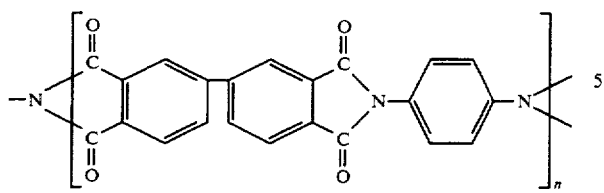

The polyimide derived from the biphenyldianhydride and 4,4'-diaminobiphenyl may have thermal expansion characteristics which are particularly well suited to microcircuit requirements. The corresponding polymers derived from isomers of the diamines mentioned above, e.g. the 3,4'- or 3,3'-diamo isomers, may also be useful, as may the corresponding polymers derived from pyromellitic dianhydride instead of the biphenyldianhydride.

In these case, the material used to adhere the polyimide film to the microcircuit device could serve as the indicator layer.

The polyimide could also be formed in situ by applying a precursor in the form of the appropriate polyamic acid and cyclising It to form the polyimide on the chip surface.

For the through-holes previously mentioned, laser drilling, preferably by ablative photodecomposition using a U.V. excimer laser, has the advantage of producing through-holes with less pronounced taper than alternative chemical etching methods, the lower degree of taper permitting closer pitch (hole-to-hole spacing). This is clearly advantageous, given that microcircuits, with which the present invention may be used, are becoming progressively smaller and more densely patterned. Through-holes with taper (measured on the substantially straight inner portions of the holes) less than 10°, preferably less than 8°, more preferably less than 6°, and especially less than 4° (relative to the axis of the through-hole) can advantageously be achieved by laser drilling according to the present invention. This is especially useful for the generally preferred holes of less than 200 micrometers diameter, e.g. 5 to 150 micrometers or 10 to 100 micrometers, and especially less than 50 micrometers diameter.

If a soluble over-layer is to be provided on the insulating layer, polyamides are preferred as aforementioned, especially amorphous polyamide.

It is an advantage of this invention that the polyamides adhere tenaciously to the polyimide, are readily and cleanly laser-drillable at the preferred wavelengths, and are readily removable by suitable solvents when desired.

Preferred amorphous polyamides include aliphatic-/aromatic polyamides, (A) polyamides based on the condensation of terephthalic acid with trimethylhexamethylene diamine (preferably containing a mixture of 2,2,4- and 2,4,4-trimethylhexamethylene diamine isomers), (B) polyamides formed from the condensation of one or more bisaminomethylnorbornane isomers with one or more aliphatic, cycloaliphatic or aromatic dicarboxylic acids e.g. terephthalic acid and optionally including one or more amino acid or lactam e.g. epsfioncaprolactam comonomers, (C) polyamides based on units derived from laurinlactam, isophthalic acid and bis-(4-amino-3-methylcyclohexyl) methane, (D) polyamides based on the condensation of 2,2-bis-(p-aminocyclohexyl) propane with adipic and azeleic acids, and polyamides based on the condensation of trans-cyclohexane-1,4-dicarboxylic acid with the trimethylhexamethylene diamine isomers mentioned above, (E) polyamides based on units derived from m-xylylenediamine and adipic acid.

Other preferred polyamides include those based on polyether and polyamide blocks, especially the so called "polyether-ester amide block copolymers" of repeating unit:

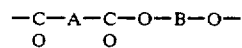

wherein A represents a polyamide sequence of average molecular weight in the range of from 300 to 15,000, preferably from 800 to 5000; and B represents a linear or branched polyoxyalkylene sequence of average molecular weight in the range of from 200 to 6000, preferably from 400 to 3000.

Preferably the polyamide sequence is formed from alpha,omega-aminocarboxylic acids, lactams or diamine/dicarboxylic acid combinations having $C_4$ to $C_{14}$ carbon chains, and the polyoxyalkylene sequence is based on ethylene glycol and/or tetramethylene glycol, and the polyoxyalkylene sequence constitutes from 5 to 85%, especially from 10 to 50% of the total block copolymer by weight. These polymers and their preparation are described in UK Patent Specification Nos. 1,473,972, 1,532,930, 1,55,644, 2,005.283A and 2,011,450A, the disclosures of which are incorporated herein by reference.

The polymer preferably has a C:H ratio of not more than 0.9, more preferably not more than 0.75, most preferably not more than 0.65 and especially not more than 0.55.

The total thickness of the perforatable layer is preferably greater than that normally used in I.C. or multichip module processing, for example 10–250 micrometers, preferably 20–100, more preferably 25–50 micrometers.

Preferably, the electrically conductive material within the holes comprises metal plated on the interior surface of the holes, and preferably each such conductive hole is electrically separate from substantially all the other such holes. The invention includes the preferred chip or other device produced by removal of at least part of the polyamide layer(s) from the surface of the insulating layer so as to leave the electrically conductive material in the holes projecting beyond the main surface of the layer. Substantially complete removal of the polyamide layer(s) is preferred.

A further layer of material may be placed on top of the second (preferably polyamide) layer, for example to assist in removal of catalyst or flash coatings of metal from the surface before an electroless plating step. Suitable materials for such further layers overlying the polyamide material may be selected, for example, from polyacrylates, polymethacrylates, cellulose esters, lacquers, mould release agents, or any other materials having adequate adhesion to the underlying layer and adequate removability, preferably by means of a solvent which does not dissolve the underlying layer.

BRIEF DESCRIPTION OF THE DRAWINGS

A FIGURE an example of the method according to the present invention will now be described in more detail with reference to the accompanying drawing which shows schematically, and not to scale, successive steps in the method.

In step A a wafer of integrated circuit devices 10 with bonding sites 11 schematically indicated on its surface has an end-point layer A of fluoropolymer (from Hoechst) spin coated thereon and dried by conventional techniques. In step B there is applied to the surface of the end-point layer A a layer B of a coatable polyimide material as hereinbefore described from National Starch, Du Pont, or Hitachi, again applied by spin coating followed by drying and curing in conventional manner. In step C there is applied to the surface of the polyimide layer B a layer C of one of the preferred amorphous polyamide materials hereinbefore described, again by spin coating and drying in conventional manner. In step D a KrF ultraviolet excimer laser is used with suitable projection imaging optics to deliver sufficiently high fluence to drill through the polyamide layer C and polyimide layer B until it reaches the end-point layer A, which generates ablation products having a characteristic mass spectrograph peak which can be detected by a mass spectrograph sampling tube positioned close to the ablation target. Upon detection of that characteristic peak generated by the end-point layer A, the laser drilling is stopped. In step E, the end-point layer A is etched away to expose the underlying bonding sites 11. In step F, chromium, then a mixture of chromium and copper, and then copper are sputtered into the holes through shadow mask F to provide an adherent metal coating on the bonding sites and on the sides of the holes. In step G, a layer of nickel is electrolessly plated onto the preceding metal coating using a first electroless "nickel strike" bath e.g. "ACR 2090" from American Chemical Refining Co, followed by the main electroless nickel plating bath "ACR 1305", with the usual cleaning, preparation and rinsing steps. In step H, solder is applied to the nickel-plated tubes, for example by wave coating, or preferably by evaporation through a shadow mask similar to that In step F. The solder may be applied beyond the edges of the holes and may then be re-flowed to position it more precisely In the tubes as Indicated at H'. In step I, the removable polyamide layer C Is dissolved away to leave the ends of the solder-containing tubes I projecting from the polymer coating for convenient bonding to other electrical circuitry, in a manner similar to known "flip chip" techniques. If desired, the polyimide layer B may also be removed by means of suitable solvents or other techniques, as indicated at I', and the end-point layer A may similarly be removed if desired as Indicated at I''. The soldering step (I—I) could be performed after the removal step I) if solder is desired on the outside of the metal tubes as well as inside.

Thus, an integrated micro-circuit device with projecting electrical connections of relatively high aspect ratio is produced which is suitable for vertical connection to the aforementioned other circuitry.

For thermocompression bonding, the solder may be replaced with gold or other thermocompression-bondable metal plated or otherwise applied to the ends of the plated metal tubes within the holes in the polymer layers. In this case, especially preferred polyimide materials for the insulating layer are those which are capable of retaining at least 50%, preferably at least 75%, more preferably at least 85%, of their original elongation after immersion in water of pH 10 at 100° C. for four days according to ASTM D882. It will be readily understood that a sufficiently fully cyclised polyimide having less than 5%, or if possible substantially no open imide rings or uncyclised amic acid groupings may be preferable to survive hot alkaline metal plating baths, which attack known polyimides such as Kapton (TM).

The integrated circuit devices referred to could for example be silicon or gallium arsenide microchips for "flip chip" mounting in interconnect circuitry packages, for example fan-out circuit boards or multi-chip modules.

Although one hole per chip bonding site may be sufficient in many cases, it is possible, owing to the high precision of the preferred techniques described, to drill more than one smaller hole per bonding site, so as to provide a degree of duplication and possibly higher reliability in use. The holes will preferably have a tortuosity factor (mean path length/sheet thickness) less than 3, preferably less than 1.2; and will preferably have an aspect ratio (length/diameter) of at least 2.5.

The preferred conductive materials are metals, preferably plated, especially electrolessly plated, on the interior of the holes. Examples of suitably applicable metals include Ni, Cu, Au, Pd.

The tubular form of the plated metal can be used to provide relatively tall "posts" of solder or other fusible metals, e.g. indium, lead-tin, gold-tin, lead, tin, lead-indium, supported by the tubular formation.

We claim:

1. A method of providing an integrated circuit semiconductor device with electrically conductive material projecting from the device bonding sites for bonding to a matching array of electrical contacts with which the device will be face-to-face in use, comprising:
    (a) providing a said device having an electrically insulating layer at least 5 micrometers thick adhering to the surface of the device;
    (b) perforating the insulating layer by U.V. laser ablation to provide at least one hole through the insulating layer communicating with a bonding site, the perforation being at least partly effected using an excimer laser;
    (c) depositing electrically conductive material within the hole(s) to establish electrical connection to the bonding site(s); and
    (d) excluding, or if necessary, removing, deposited conductive material from the main surface of the insulating layer, so as to provide the conductive material substantially only within the said hole(s);
wherein an in indicator layer is provided at the interface of the said insulating layer and the device, said indicator layer comprising material which generates a detectable indication when directly acted upon by a first perforating operation, and the first perforating operation is moderated, or is replaced by a gentler second perforating operation, upon detection of the said indication.

2. A method according to claim 1, including the step of removing some or all of the insulating layer to expose at least part of the conductive material deposited within the hole(s).

3. A method according to claim 1, wherein the first perforating operation is U.V. laser ablation, which is terminated upon detection of the said indication.

4. A method according to claim 1, wherein the second perforating operation is chemical etching and is used to complete the perforation through the indicator layer to the underlying bonding site(s).

5. A method according to claim 1, including the step of applying the indicator layer.

6. A method according to claim 1, wherein the indicator layer comprises a fluoropolymer.

7. A method according to claim 1, including the step of applying the insulating layer.

8. A method according to claim 1, wherein the insulating layer comprises organic polymeric material.

9. A method according to claim 1, wherein the insulating layer comprises inorganic material.

10. A method according to claim 1, wherein a removable layer is provided overlying the insulating layer with the said hole(s) passing through both layers, and the removable layer is removed to expose the end(s) of the conductive material deposited within the hole(s).

11. A method according to claim 10, wherein the removable layer comprises an organic polymeric material.

12. A method according to claim 1, wherein the deposition operation produces a tubular formation of the electrically conductive material in the hole(s).

13. A method according to claim 1, wherein the said holes are 5 to 200 micrometers in diameter.

14. A method according to claim 1, wherein the total thickness of the layer(s) on the said surface of the device is 10-250 micrometers.

15. A method according to claim 1, wherein the deposition operation involves sputtering, evaporation or ion plating of metal onto the bonding pad(s) and the interior surface of the hole(s), followed by removal of the metal (if any) from the main surface of the insulating layer.

16. A method according to claim 1, wherein the deposition operation involves electroless plating of metal onto the surface(s) within the hole(s), followed by removal of any metal which may have been electrolessly plated on the main surface of the insulating layer.

17. A method according to claim 1, wherein the deposition operation is followed by application of solder into the hole(s) and/or onto metal already in the hole(s).

18. A method according to claim 17, wherein the applied solder is subsequently re-flowed.

19. An integrated circuit semiconductor device provided with electrically conductive material on one or more of its bonding sites by a method according to claim 1.

20. An integrated circuit semiconductor device having on its surface an adherent indicator layer as specified in claim 1.

21. A device according to claim 20, having adhered to the indicator layer an insulating layer, with or without further removable layers overlying the insulating layer.

* * * * *

UNITED STATES PATENT AND TRADEMARK OFFICE
CERTIFICATE OF CORRECTION

PATENT NO. : 5,411,918
DATED : May 2, 1995
INVENTOR(S) : Keible et al.

It is certified that error appears in the above-indentified patent and that said Letters Patent is hereby corrected as shown below:

Column 5, Line 65, replace "epsfioncaprolactam", by --epsiloncaprolactam--.

Column 6, Line 34, replace "2,005.283A" by --2,005,283A--.

Column 7, Line 44, replace "In" by --in--.

Column 7, Line 47, replace (precisely) "In" by --in--.

Column 7, Line 56, replace "(I-I)", by--(H)--.

Column 7, Line 57, replace "I)", by --(I)--.

Signed and Sealed this

Twenty-third Day of January, 1996

Attest:

BRUCE LEHMAN

*Attesting Officer*  *Commissioner of Patents and Trademarks*